(12) United States Patent
Cordier

(10) Patent No.: US 11,005,514 B2
(45) Date of Patent: May 11, 2021

(54) AMPLIFICATION CIRCUIT, CONTROLLER, AND TRANSCEIVER CIRCUIT

(71) Applicant: STMicroelectronics (Rousset) SAS, Rousset (FR)

(72) Inventor: Nicolas Cordier, Aix-en-Provence (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/844,246

(22) Filed: Apr. 9, 2020

(65) Prior Publication Data

US 2020/0252096 A1 Aug. 6, 2020

Related U.S. Application Data

(63) Continuation of application No. 16/265,167, filed on Feb. 1, 2019, now Pat. No. 10,644,739.

(30) Foreign Application Priority Data

Feb. 15, 2018 (FR) ...................................... 1854271

(51) Int. Cl.
*H04B 1/38* (2015.01)
*H03F 3/24* (2006.01)
(Continued)

(52) U.S. Cl.
CPC ............... *H04B 1/38* (2013.01); *H03F 1/565* (2013.01); *H03F 3/211* (2013.01); *H03F 3/245* (2013.01);
(Continued)

(58) Field of Classification Search
CPC ........................................................ H04B 1/38
See application file for complete search history.

(56) References Cited

U.S. PATENT DOCUMENTS 4,274,002 A * 6/1981 Tomita ................. G01T 1/1642
250/363.07
5,434,538 A * 7/1995 Lee .......................... H03F 3/211
330/124 R
(Continued)

FOREIGN PATENT DOCUMENTS

CN 104335486 A 2/2015
CN 105813185 A 7/2016
(Continued)

*Primary Examiner* — Hsinchun Liao
(74) *Attorney, Agent, or Firm* — Slater Matsil, LLP

(57) ABSTRACT

An amplification circuit includes a first group of amplifiers including N first amplifiers, a second group of amplifiers including K second amplifiers, a first terminal, a second terminal, and a third terminal. Each of the N first amplifiers and each of the K second amplifiers includes an output. The second group of amplifiers is divided into a first subassembly of amplifiers and a second subassembly of amplifiers. The first subassembly includes M second amplifiers of the second group. The second subassembly includes K-M remaining second amplifiers of the second group. The first terminal is coupled to each output of the N first amplifiers and to a first radio frequency output terminal. The second terminal is coupled to each output of the M second amplifiers. The third terminal is coupled to each output of the K-M second remaining amplifiers and to a second radio frequency output terminal.

20 Claims, 4 Drawing Sheets

(51) Int. Cl.

| | | |
|---|---|---|
| *H04B 5/02* | (2006.01) | |
| *H03F 1/56* | (2006.01) | |
| *H04B 5/00* | (2006.01) | |
| *H03F 3/68* | (2006.01) | |
| *H03F 3/21* | (2006.01) | |
| *H04B 1/04* | (2006.01) | |

(52) U.S. Cl.
CPC ............ *H03F 3/68* (2013.01); *H04B 5/00* (2013.01); *H04B 5/02* (2013.01); *H03F 2200/387* (2013.01); *H03F 2200/451* (2013.01); *H04B 1/04* (2013.01)

(56) References Cited

U.S. PATENT DOCUMENTS

| | | |
|---|---|---|
| 9,231,526 B2 | 1/2016 | Okazaki et al. |
| 2009/0201084 A1 | 8/2009 | See et al. |
| 2012/0126288 A1* | 5/2012 | Bito ............ H01L 27/0605 257/192 |
| 2015/0177725 A1 | 6/2015 | Miura |
| 2015/0303879 A1 | 10/2015 | Murao |
| 2016/0079928 A1 | 3/2016 | Okazaki et al. |
| 2016/0261976 A1 | 9/2016 | Butler et al. |
| 2017/0155429 A1 | 6/2017 | Hung et al. |
| 2017/0250469 A1 | 8/2017 | Robert et al. |
| 2018/0069511 A1* | 3/2018 | Zhu ............... H03F 3/4508 |
| 2018/0302040 A1* | 10/2018 | Hellberg ........... H03F 1/0288 |
| 2019/0253092 A1 | 8/2019 | Cordier |

FOREIGN PATENT DOCUMENTS

| | | |
|---|---|---|
| CN | 106817153 A | 6/2017 |
| CN | 107124045 A | 9/2017 |
| CN | 107409277 A | 11/2017 |
| CN | 209419611 U | 9/2019 |
| EP | 2690779 A2 | 7/2013 |
| EP | 2690779 A3 | 7/2013 |

* cited by examiner

AMPLIFICATION CIRCUIT, CONTROLLER, AND TRANSCEIVER CIRCUIT

CROSS-REFERENCE TO RELATED APPLICATIONS

This application is a continuation application of U.S. application Ser. No. 16/265,167 filed on Feb. 1, 2019, which claims priority to French Patent Application No. 1851271, filed on Feb. 15, 2018, which applications are hereby incorporated herein by reference in their entirety.

TECHNICAL FIELD

The present disclosure generally relates to electronic devices integrating a near field communication circuit (NFC).

BACKGROUND

Near field communication systems are more and more frequent and can be found in many applications.

Such systems use a radio frequency electromagnetic field emitted by a device (terminal or reader) to communicate with another device (card).

According to applications, a NFC device only communicates in card mode or the same NFC device can operate in card mode or in reader mode (for example, in the case of a near-field communication between two cellular phones).

When it operates in reader mode, a device generates a radio frequency electromagnetic field intended to be detected by devices present within its range (operating in card mode).

When it operates in card mode, a NFC device detects a radio frequency electromagnetic field generated by a device operating in reader mode. Certain devices (essentially so-called passive load modulation devices) sample the power necessary for their operation from the field radiated by a reader having them within its range and retro-modulate the field of the terminal. Other devices (with an active load modulation) have their own power source in order to be capable of transmitting a signal to respond to the reader in synchronized fashion.

SUMMARY

In accordance with an embodiment of the invention, an amplification circuit includes a first group of amplifiers including N first amplifiers, a first terminal coupled to each output of the N first amplifiers, and a second group of amplifiers including N second amplifiers. Each of the N first amplifiers and each of the N second amplifiers includes an output. The second group of amplifiers is divided into a first subassembly of amplifiers and a second subassembly of amplifiers. The first subassembly includes M second amplifiers of the second group and the second subassembly includes N-M remaining second amplifiers of the second group. The amplification circuit further includes a second terminal and a third terminal. The second terminal is coupled to each output of the M second amplifiers and the third terminal is coupled to each output of the N-M second remaining amplifiers.

In accordance with another embodiment of the invention, an NFC controller includes at least one amplification circuit which includes a first group of amplifiers including N first amplifiers, a first terminal coupled to each output of the N first amplifiers, and a second group of amplifiers including N second amplifiers. Each of the N first amplifiers and each of the N second amplifiers includes an output. The second group of amplifiers is divided into a first subassembly of amplifiers and a second subassembly of amplifiers. The first subassembly includes M second amplifiers of the second group and the second subassembly includes N-M remaining second amplifiers of the second group. The amplification circuit further includes a second terminal and a third terminal. The second terminal is coupled to each output of the M second amplifiers and the third terminal is coupled to each output of the N-M second remaining amplifiers.

In accordance with still another embodiment of the invention, an NFC transceiver circuit includes a controller including at least one amplification circuit, the at least one amplification circuit including a first group of amplifiers including N first amplifiers, a first terminal coupled to each output of the N first amplifiers, and a second group of amplifiers including N second amplifiers. Each of the N first amplifiers and each of the N second amplifiers includes an output. The second group of amplifiers is divided into a first subassembly of amplifiers and a second subassembly of amplifiers. The first subassembly includes M second amplifiers of the second group and the second subassembly includes N-M remaining second amplifiers of the second group. The amplification circuit further includes a second terminal and a third terminal. The second terminal is coupled to each output of the M second amplifiers and the third terminal is coupled to each output of the N-M second remaining amplifiers.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
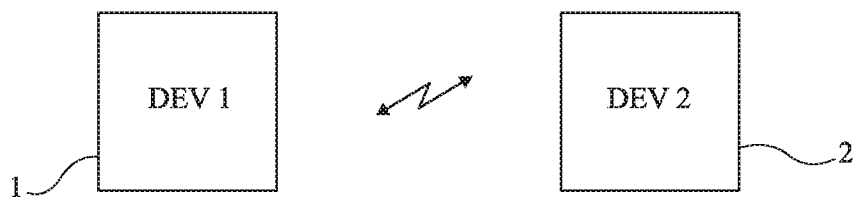
FIG. 1 is a very simplified representation in the form of blocks of an example of a near-field communication system of the type to which embodiments which will be described apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the generation of the radio frequency signals and the interpretation thereof have not been detailed, the described embodiments being compatible with usual techniques of generation and interpretation of these signals.

Throughout the present disclosure, the term "connected" is used to designate a direct electrical connection between circuit elements, whereas the term "coupled" is used to designate an electrical connection between circuit elements that may be direct, or may be via one or more intermediate elements. Unless indicated otherwise, when the term "coupled" is used, the connection can be implemented by a direct connection.

The terms "approximately", "about", and "in the order of" are used herein to designate a tolerance of plus or minus 10%, preferably of plus or minus 5%, of the value in question.

The present disclosure particularly aims at an active modulation NFC controller. An NFC device equipped with such a controller comprises one or more antennas.

Embodiments of the present disclosure are directed to an active modulation NFC controller. A NFC device equipped with such a controller comprises one or a plurality of antennas.

Various embodiments of the invention can overcome all or part of the disadvantages of usual NFC devices.

Embodiments provide a NFC controller adapted to two antennas.

Embodiments provide a solution adapted to a NFC device capable of operating in card mode and in reader mode.

Embodiments provide an amplification circuit comprising two groups of the same number of amplifiers. Amplifier outputs of a first group are interconnected to a first terminal and amplifier outputs of a second group are distributed into two sub-assemblies respectively interconnected to second and third terminals.

According to embodiments, each group of amplifiers is identical.

According to embodiments, the amplifiers of the same group have different powers.

According to embodiments, the two sub-assemblies of amplifiers of the second group have different powers.

According to embodiments, the amplifiers of the first group are controllable together, the amplifiers of the two subassemblies of the second group are either controllable together or separately controllable. One of the sub-assemblies can then controlled with the first group of amplifiers.

According to embodiments, each amplifier is a class-D amplifier.

Embodiments provide an NFC controller comprising at least one amplification circuit.

According to embodiments, the controller comprises two outputs, wherein the ratio between the respective powers supplied by the two outputs is 1 if the second and third terminals of the amplification circuit are interconnected and is different from 1 if the first and second terminals of the amplification circuit are interconnected.

Embodiments provide an NFC transceiver circuit comprising a controller.

According to embodiments, the NFC transceiver circuit comprises an impedance matching circuit and an antenna having differential inputs.

According to embodiments, second and third terminals of the amplification circuit are interconnected.

According to embodiments, the NFC transceiver circuit comprises two impedance matching circuits and two antennas, each having a non-differential input and a terminal coupled to a ground.

According to embodiments, the first and second terminals of the amplification circuit are interconnected.

Embodiments provide an NFC device comprising at least one NFC transceiver circuit.

The foregoing and other features and advantages will be discussed in greater detail in the following non-limiting description of specific embodiments in connection with the accompanying drawings.

FIG. 1 is a very simplified representation in the form of blocks of an example of a near-field communication system of the type to which embodiments which will be described apply.

Although the case of two similar electronic devices, for example, two cellular phones, is assumed, all that will be described more generally applies to any system where a transponder detects an electromagnetic field radiated by a reader or terminal. For simplification, reference will be made to NFC devices to designate electronic devices integrating near-field communication circuits.

Two NFC devices 1 (DEV1) and 2 (DEV2) are capable of communicating by near-field electromagnetic coupling. According to applications, for a communication, one of the devices operates in so-called reader mode while the other operates in so-called card mode, or the two devices communicate in peer to peer mode (P2P). Each device comprises various electronic circuits for generating a radio frequency signal transmitted by means of one or a plurality of antennas. The radio frequency field generated by one of the devices is detected by the other device which is located within its range and which also comprises one or a plurality of antennas.

Reference will be made hereafter to an active load modulation device, that is, transmitting a radio frequency signal in reader mode and in card mode. It should however be noted that each device 1 or 2 may also, in reader mode, communicate with a passive load modulation card (resistive or capacitive retromodulation).

A NFC device comprises one or a plurality of oscillating circuits, each formed of an antenna (inductive element) and of a capacitive element to detect or emit an electromagnetic field. In reader or terminal mode, the oscillating circuit(s) are excited by a radio frequency signal generated by electronic circuits (NFC controller) of the device to generate a field and modulate the field according to the information to be transmitted. In card mode, the NFC controller extracts, from the electromagnetic field that it detects and which originates from a reader, the carrier frequency (typically 13.56 MHz) and the data transmitted by the reader, and transmits in synchronized fashion data in active load modulation to this reader, by transmitting a signal synchronized with that of the reader and by modulating it at the rate of a sub carrier.

NFC controllers are made in the form of integrated circuits which generate radiofrequency signals in differential mode and are capable of receiving differential radio frequency signals.

This usually requires interposing various circuits between the NFC controller and the antenna(s) according to the architecture of the device in terms of oscillating circuits. In particular, if certain devices use a single antenna attacked by a differential signal, others use a frame or non-differential (single-ended) antenna. In this last case, it is sometimes desired to use different antennas according to the operating mode (card or reader) to be able to optimize the size of the antenna used according to the concerned mode. More particularly, the power needs are generally different in card mode and in reader mode. In card mode, an antenna having a relatively small size (as compared with the antenna used in reader mode) is sufficient since, when the transmission occurs in card mode, this means that the antenna is in the field of a reader and the power need is thus lower. In reader mode, however, a larger range is generally desired, which creates a need for a larger antenna and a higher power need (also to be able to remotely supply passive load modulation cards). Typically in the case of mobile phones equipped with NFC controllers, an antenna having a (relatively) small size of the type used in telephones for GSM communications is sufficient for the card mode. However, such an antenna is insufficient for the reader mode, which requires a larger antenna. Reusing the antenna also used for telephone communications has the advantage of not requiring an additional antenna.

Thus, except for impedance matching circuits, it is often necessary to interpose, between the NFC controller and the antenna(s), various baluns, splitters, switches, etc., which are bulky since they are at least partially formed of discrete components.

The described embodiments provide a novel approach of a NFC controller compatible with different oscillating circuit architectures, without it being necessary to use a balun or antenna splitters and switches.

More particularly, various embodiments of the invention provide a NFC controller capable of being assembled in a device using a same differential antenna (attacked by a differential signal in transmit mode and receiving a differential signal in receive mode) in reader mode and in card mode, or in a device using two different antennas, one for the card mode and the other for the reader mode (each attacked in transmit mode by a non-differential signal and receiving in receive mode a non-differential signal).

Figure 2:
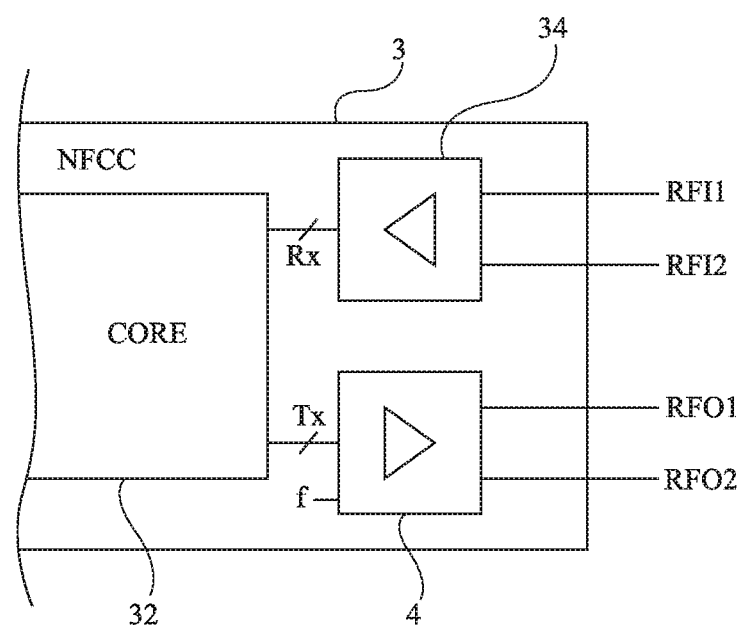
FIG. 2 very schematically shows in the form of blocks an embodiment of a NFC controller.

FIG. 2 very schematically shows in the form of blocks an embodiment of a NFC controller 3 (NFCC).

Controller 3 comprises various digital processing circuits 32 (CORE) intended to receive information to be transmitted originating from other circuits of the device and of transmitting to these other circuits information originating from other devices. Controller 3 comprises two input terminals RFI1 and RFI2 and two output terminals RFO1 and RFO2, intended to be coupled to the antenna(s) according to the device where it is assembled. Terminals RFI1 and RFI2 are coupled to a receive circuit 34 comprising, in addition to circuits of amplification of the received signals, a demodulator of the received signals. Circuit 34 supplies one or a plurality of demodulated signals Rx to digital core 32. Terminals RFO1 and RFO2 receive radio frequency signals from a transmit circuit 4 which modulates a radio frequency carrier f according to data Tx that it receives from digital core 32. Circuit 4 comprises amplifiers (drivers) amplifying the signals to be transmitted. For simplification, the other usual circuits of controller 3 and the power supply signals of the different circuits are not shown in FIG. 2.

In reader mode, terminals RFO11 and RFO2 transmit the power and the data to a device in card mode. It may be an active load modulation or passive load modulation device. Terminals RFI1 and RFI2 receive the data originating from the device in card mode.

In card mode, terminals RFI1 and RFI2 enable to recover the clock of the carrier of the reader and the data that it transmits. Terminals RFO1 and RFO2 enable to transmit data from the card-to-reader direction by active load modulation.

Controller 3 may be assembled in a device either with the two terminals RFO1 and RFO2 coupled to an antenna to be attacked by differential signals (the signals being in phase opposition), or to two antennas attacked by non-differential signals.

For this purpose, a specific structure of the amplifiers of circuit 4 and of their coupling to terminals RFO1 and RFO2 is provided.

Figure 3:
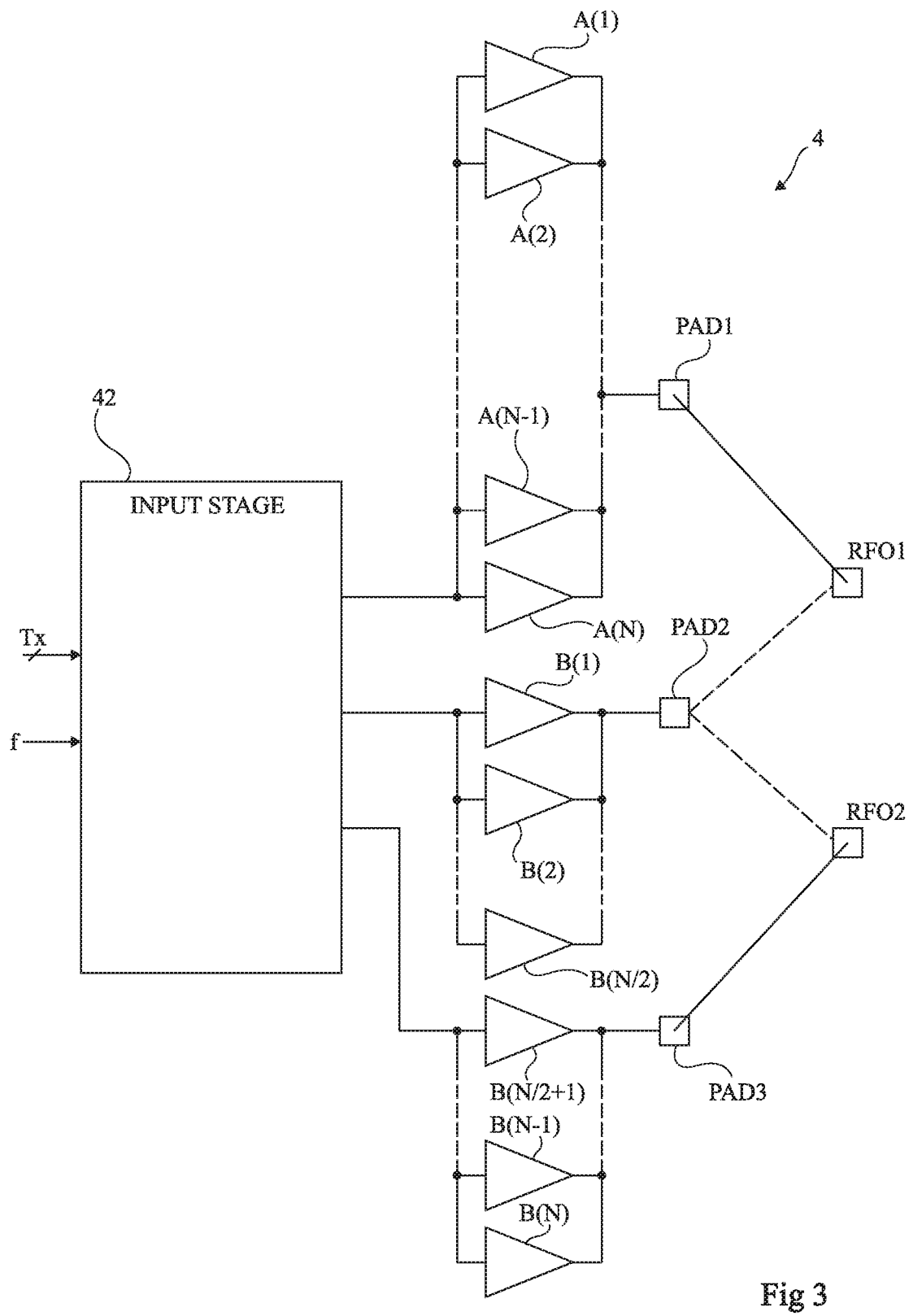
FIG. 3 very schematically shows in the form of blocks an embodiment of an amplification circuit.

FIG. 3 very schematically shows in the form of blocks an embodiment of an amplification circuit 4 and of its coupling to terminals RFO1 and RFO2.

It is provided to manufacture transmission amplification circuit 4 in the form of two groups A and B, each comprising a same number N (at least two) of elementary amplifiers A(i), respectively B(i), (i being in the range from 1 to N). Preferably, the N elementary amplifiers of each group are different, that is, the N amplifiers of a group each have a different resistance, and thus each supply a different power. Preferably, a binary weighting is provided, that is, the resistance of an amplifier of rank i represents twice the resistance of the amplifier of rank i−1 and half the resistance of the amplifier of rank i+1. In other words, the lower the rank i of the amplifier, the more it contributes for a significant power in the transmission.

It is further provided to interconnect the amplifier outputs differently according to whether controller 3 is connected to a system having a differential antenna or to a system having two single-ended antennas.

For a connection to a differential antenna, it is desired for each terminal of the antenna to receive the same power from terminal RFO1 and from terminal RFO2, in practice, signals of same amplitude but in phase opposition. Accordingly, the number of elementary amplifiers coupled to each antenna has to be the same and each group has to comprise the same distribution of elementary powers. Thereby, an even total number 2N of amplifiers is used and groups A and B are identical in terms of distribution of the weighting of the different elementary amplifiers that they comprise. In the example of FIG. 3, number N is also even but it may as a variation be odd.

The outputs of the N amplifiers A(i) of group A are interconnected to a pad PAD1. Further, the outputs of the N amplifiers B(i) of group B are interconnected in sub-assemblies. In the example of FIG. 3, an interconnection by halves is provided (N being even), but the distribution of the amplifiers between the two sub-assemblies may be different. However, each sub-assembly comprises amplifiers of successive ranks so that a sub-assembly gathers the strongest amplifiers in the group while the other gathers the weakest amplifiers in the group.

Assuming the distribution in halves of FIG. 3, the outputs of amplifiers B(i) to B(N/2) are interconnected to a pad PAD2 and the outputs of amplifiers B(N/2+1) to B(N) are interconnected to a pad PAD3.

Such a configuration enables to use a transmit (or amplification) circuit 4 either for an assembly where terminals RFO1 and RFO2 are coupled to two terminals of an antenna (differential) receiving from the amplifiers of circuit 4 a differential signal, or for an assembly where terminals RFO1 and RFO2 are coupled to a terminal of a different single-ended or frame antenna, having its other terminal coupled, preferably connected, to ground. It is sufficient, on assembly of the integrated circuit forming controller 3 and integrating circuit 4, to weld pads PAD1 and PAD3 respectively to terminals RFO1 and RFO2, and to weld PAD2 either to terminal RFO1 or to terminal RFO2. Thus, the amplifier operates either with terminals RFO1 and RFO2 providing different amplification gains, or with terminals providing the same amplification gain (ratio 1) on the two terminals RFO1 and RFO2.

More specifically, for an assembly with a differential antenna, pad PAD is welded to terminal RFO1 and pads PAD2 and PAD3 are welded to terminal RFO2. Thus, each terminal receives the same power.

However, for an assembly with two different single-ended antennas (for example, the GSM antenna of the telephone and a larger antenna on the back side of the telephone), pads PAD1 and PAD2 may be connected to terminal RFO1 and pad PAD3 may be connected to terminal RFO2. Thus, the antenna of relatively small size intended for the card mode, which only needs to receive a relatively small power for the active load modulation transmission, is powered with the weakest amplifiers of group B while the other larger antenna intended for the reader mode, for which a stronger power is desired, uses not only all the amplifiers of group A, but also the strongest amplifier of group B.

The inputs of amplifiers A(i) and B(i) are generally individually controlled by signals originating from an input stage 42 (INPUT STAGE) of circuit 4 receiving signals Tx to be transmitted and carrier f. However, it may here also be provided to interconnect all the inputs of amplifiers A(i) and the inputs of amplifiers B(i), in the example of FIG. 3, by halves (the inputs of amplifiers B(1) to B(N/2) being interconnected and the inputs of amplifiers B(N/2+1) to B(N) being interconnected). In this case, input stage 42 integrates a selector interconnecting the inputs of amplifiers B(1) to B(N/2) either with the inputs of the amplifiers A(i) of group A, or with the inputs of amplifiers B(N/2+1) to B(N).

This amounts to making half of the 2N amplifiers controllable together, the remaining amplifiers being either controllable together, or separately controllable by sub assemblies, one of the sub-assemblies being then controlled with half (the first half) of the amplifiers.

In the case where the distribution of the amplifiers of group B in sub-assemblies is different (not in halves), the interconnection of the inputs should of course be consistent with the interconnection of the outputs.

Thus, according to the antenna structure provided in the device having NFC controller 3 assembled therein, it is sufficient to connect in adapted fashion pads PAD1, PAD2, and P1D3 to terminals RFO1 and RFO2 (representing the input terminals of one or of two impedance matching circuits between controller 3 and the antenna(s), according to the case).

The selection of the resistive ratios (or power ratios) from one amplifier to the next one in each group A or B may be performed in different ways and depends on the powers desired in the application.

A distribution may for example be obtained from simulations performed in one mode and in the other with the different possible antenna sizes.

According to another example, an equivalent model of an operation in differential mode and in non-differential mode is used to determine the impact of the resistances of the elementary amplifiers.

According to still another example, it can be considered that at the first order, the current Irms in an antenna with a differential assembly (group A on an input of the antenna and group B on the other input of the antenna) may be written as:

$$Irms = \frac{2\sqrt{2}}{\pi} \times \frac{VDD\_RF}{R_{RFO1} + R_{RFO2} + R_{LOAD}},$$

with VDD_RF representing the power supply voltage of the amplifiers, $R_{RFO1}$ representing the equivalent series resistance of the amplifiers coupled to terminal RFO1, $R_{RFO2}$ representing the equivalent series resistance of the amplifiers coupled to terminal RFO2, and $R_{LOAD}$ representing the equivalent resistance of the circuits (matching network and antenna) connected to terminals RFO1 and RFO2.

The power Pload supplied to the load (and thus to the antenna) can be written as:

$$Pload = R_{LOAD} \times \left( \frac{2\sqrt{2}}{\pi} \times \frac{VDD\_RF}{R_{RFO1} + R_{RFO2} + R_{LOAD}} \right)^2.$$

Similarly, it can be considered that, at the first order, currents Irms1 and Irms2 in single-ended antennas with a non-differential assembly (group A and a portion of group B on terminal RFO1 and the rest of group B on terminal RFO2) can be written as:

$$Irms1 = \frac{\sqrt{2}}{\pi} \times \frac{VDD\_RF}{R_{RFO1} + R_{LOAD}}, \text{ and}$$

$$Irms2 = \frac{\sqrt{2}}{\pi} \times \frac{VDD\_RF}{R_{RFO2} + R_{LOAD}}.$$

Powers Pload1 and Pload2 supplied to the antennas can be written as:

$$Pload1 = R_{LOAD} \times \left( \frac{\sqrt{2}}{\pi} \times \frac{VDD\_RF}{R_{RFO1} + R_{LOAD}} \right)^2, \text{ and}$$

$$Pload2 = R_{LOAD} \times \left( \frac{\sqrt{2}}{\pi} \times \frac{VDD\_RF}{R_{RFO2} + R_{LOAD}} \right)^2.$$

It is thus possible, based on these formulas and taking into account the resistance ratio between the different amplifiers of a same group, to distribute the amplifiers of group B into two sub-assemblies adapted to the non-differential mode. For the differential mode, it is remained with a distribution of group A on one path and of group B on the other path, taking advantage of the fact that the two groups A and B are identical.

As a specific embodiment, a structure of the type shown in FIG. 3 has been formed with group A and B of eight amplifiers each (N=8), each amplifier or amplification segment having a series resistance which is double that of the previous amplifier (binary weighted). With resistances having respective approximate values of 1.4 ohms, 2.8 ohms, 5.4 ohms, ii ohms, 21 ohms, 41 ohms, 82 ohms, and 162 ohms, all the amplifiers of a group are used, it can be considered that the equivalent resistance of the group is approximately equal to half the smallest resistance, or approximately 0.7 ohms. Now, in card mode in a non-differential assembly, such a power is not needed.

The number of amplifiers assigned to the card mode, that is, coupled to terminal RFO2, can thus be decreased. For example, only half of amplifiers B(i), that is, those providing the lowest gain (amplifiers B(N/2+1) to B(N), FIG. 4), are then used. Thus, the strongest amplifiers (B(1) to B(N/2)) may be assigned to the reader mode by being coupled to terminal FRO1, which further decreases the series resistance. With the above-mentioned numerical example, the equivalent resistance of path RFO1 is approximately 11 ohms (half the series resistance of amplifier B(5)) and that of path RFO2 is approximately 0.4 ohms, due to the contribution of amplifier B(1).

Other distributions are of course possible.

Further, although a distribution of the elementary amplifiers with binary weightings (approximate doubling of the gain from one amplifier to the next one) has been described, other distributions, even elementary amplifiers all identical to one another, may be provided. In this case, the series resistance difference between the reader mode and card modes in non differential mode is less significant.

Figure 4:
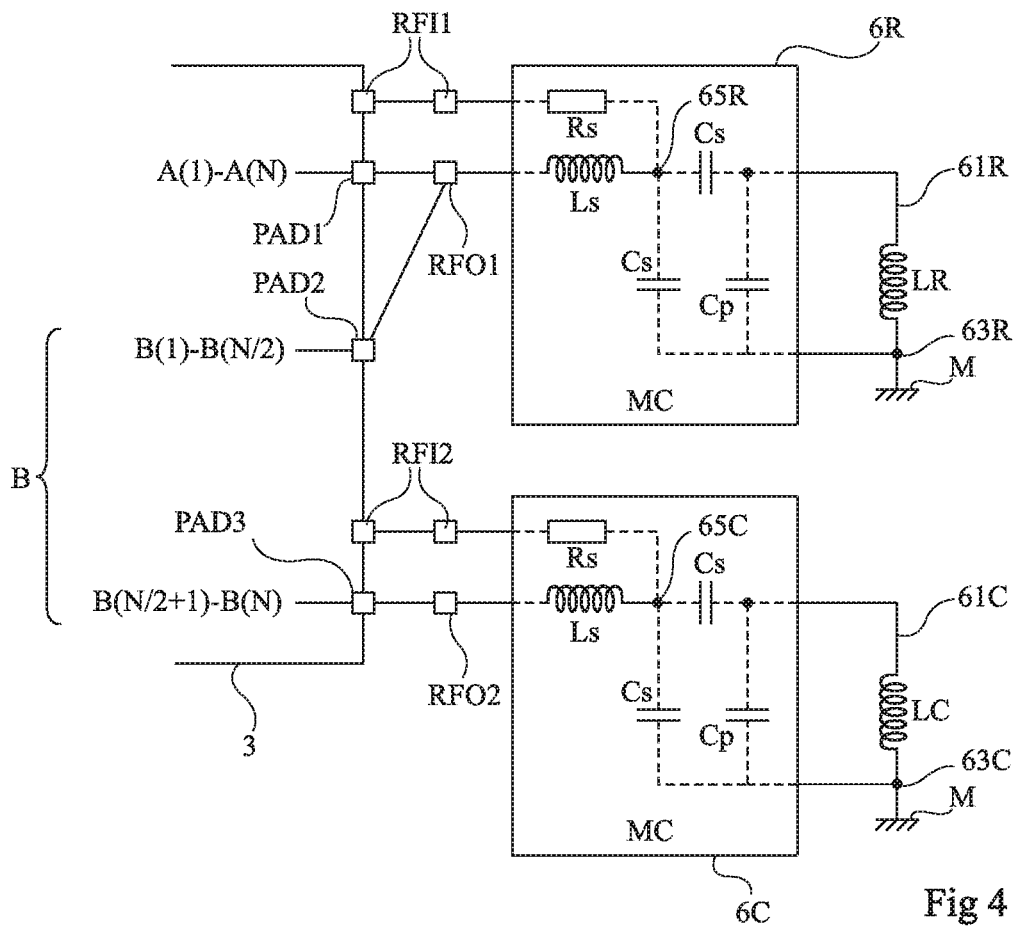
FIG. 4 very schematically shows in the form of blocks an example of coupling of a NFC controller in a device comprising two antennas respectively dedicated to the reader mode and to the card mode.

FIG. 4 very schematically shows in the form of blocks an example of coupling of a NFC controller 3 in a device with two antennas LR and LC respectively dedicated to the reader mode and to the card mode.

Each antenna LR, LC is associated with an impedance matching circuit 6R, 6C (MC) coupling it to controller 3. More specifically, a first terminal 61R of antenna LR is coupled, by impedance matching circuit 6R, to terminals RFI1 and RFO1, a second terminal 63R of antenna LR being coupled, preferably connected, to ground M. A first terminal 61C of antenna LC is coupled, by impedance matching circuit 6C, to terminals RFO2 and RFI2, a second terminal 63C of antenna LC being coupled, preferably connected, to ground M. FIG. 4 shows the example of FIG. 3 where group B is divided by half into two sub-assemblies, the strongest elementary amplifiers being coupled to terminal RFO1. Terminal RFO1 is thus coupled, preferably connected, to terminals or pads PAD1 and PAD2 of controller 3 while terminal RFO2 is coupled, preferably connected, to terminal or pad PAD5 of controller 3.

FIG. 4 also illustrates examples of impedance matching circuits 6R and 6C (MC) highlighting their similar structures. This is only an example illustrated in dotted lines and any impedance matching circuit may be suitable. Each circuit 6R, 6C comprises a capacitor Cp in parallel on the corresponding antenna, that is, coupled, preferably connected, to terminals 61R, respectively 61C, and 63R, respectively 63C. Terminals 61R and 63R, respectively 61C and 63C, are each coupled, by a capacitor Cs, to a common node 65R, respectively 65C. Node 65R, respectively 65C, is coupled by an inductive element Ls to terminal RFO1, respectively RFO2, and by a resistive element Rs to terminal RFI1, respectively RFI2. The operation of the impedance matching circuit is usual per se.

Figure 5:
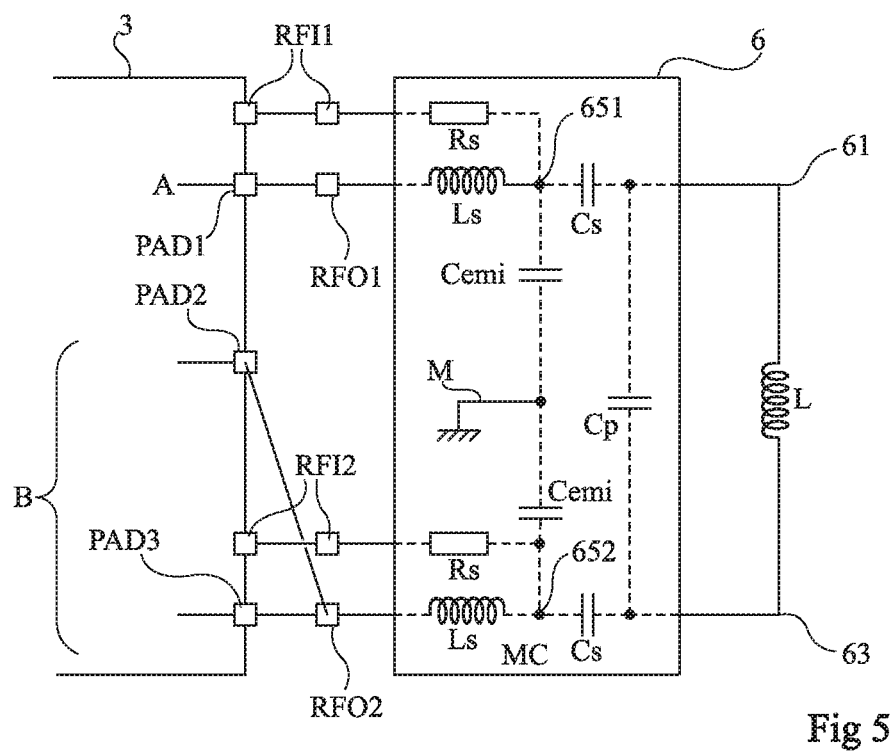
FIG. 5 very schematically shows in the form of blocks an example of coupling of a NFC controller in a device having a differential antenna.

FIG. 5 schematically shows in the form of blocks an example of coupling of a NFC controller 3 in a device having a differential antenna L.

Antenna L is associated with an impedance matching circuit 6 (MC) coupling it to controller 3. More specifically, a first terminal 61 of antenna L is coupled, by circuit 6, to terminals RFI1 and RFO1 and a second terminal 63 of antenna L is coupled, by circuit 6, to terminals RFO2 and RFI2. In order for the signal amplification powers to be the same on each differential path in transmit mode (ratio 1), terminal RFO1 is coupled, preferably connected, to terminal or pad PAD1 of controller 3 while terminal RFO2 is coupled, preferably connected, to terminals or pads PAD2 and PAD3 of controller 3.

FIG. 5 also illustrates an example of matching circuit 6 (MC) highlighting its similar structure on each differential path. This is only an example illustrated in dotted lines and any impedance matching circuit may be suitable. Circuit 6 comprises a capacitor Cp in parallel on antenna L, that is, coupled, preferably connected, to terminals 61 and 63. Terminals 61 and 63 are each coupled, by a capacitor Cs to a node 651, respectively 652. Each node 651, 652 is coupled by an inductive element LS to terminal RFO1, respectively RFO2, and by a resistive element Rs to terminal RFI1 respectively RFI2. Further, nodes 651 and 652 are each coupled, by a capacitor Cemi, to ground M. The operation of the impedance matching circuit is here again usual per se.

The connection of pads PAD1, PAD2 and PAD3 to terminals RFO1 and RFO2 is performed on manufacturing, for example, during the packaging, of the NFC controller. Indeed, according to the NFC device for which controller 3 is intended, it is known at that time whether it is intended to operate in differential or non-differential mode. As a variation, this connection is performed during the assembly of the circuits of the NFC device. However, such a connection is definitive and is thus performed by welding. Indeed, one of the objects is to decrease the bulk and thus to avoid a switch.

Figure 6:
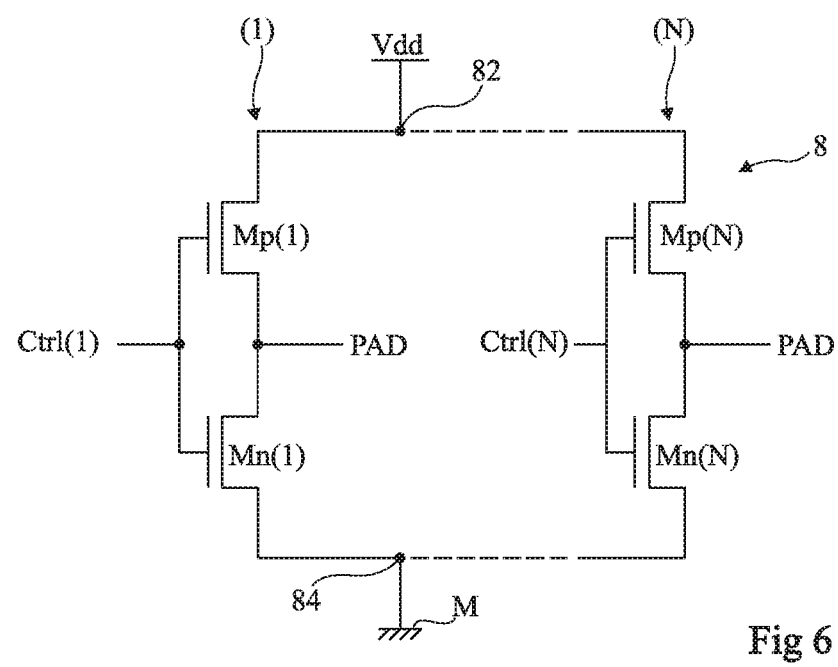
FIG. 6 shows an embodiment of an amplification circuit comprising a plurality of elementary amplifiers.

FIG. 6 shows an embodiment of an amplification circuit comprising a plurality of elementary amplifiers.

FIG. 6 shows an example of amplifier 8 capable of forming group A or B of elementary amplifiers of FIG. 3. In this example, a class-D amplifier where each elementary amplifier (i), i being in the range from 1 to N, comprises two MOS transistors Mp(i) and Mn(i) in series between two terminals 82 and 84 of application of a positive voltage Vdd referenced to ground M (terminal 84), is assumed. All elementary amplifiers (i) are in parallel between terminals 82 and 84. The gates of each transistor of each elementary (i) are interconnected to a control terminal Ctrl(i) coupled to the input stage (42, FIG. 3). The junction point of transistors Mp(i) and Mn(i) of each elementary amplifier (i) is coupled, preferably connected, to the output pad PAD corresponding to group A or to the half-group of the group B to which it belongs. Thus, the forming of an amplification circuit 4 compatible with an assembly in differential mode or in non-differential mode is particularly simple.

An advantage of the described embodiments is that they enable to provide a NFC controller compatible with two different types of operation regarding its coupling to the antenna(s), without for all this requiring a mode-switching transformer or an antenna switch.

An advantage of the described embodiments is that they thus enable to decrease the bulk of the transmission circuits of a NFC device.

Various embodiments have been described. Various modifications will occur to those skilled in the art. In particular, the sizing of the impedance matching circuits and of the amplifiers of the NFC controller depends on the application. Further, the practical implementation of the embodiments which have been described is within the abilities of those skilled in the art by using the functional indications given hereabove.

Such alterations, modifications, and improvements are intended to be part of this disclosure, and are intended to be within the scope of the embodiments of the present invention described herein. Accordingly, the foregoing description is by way of example only and is not intended to be limiting. The present description is limited only as defined in the following claims and the equivalents thereto.

What is claimed is:

1. An amplification circuit comprising:
 a first group of amplifiers comprising N first amplifiers, each of the N first amplifiers comprising an output;
 a first terminal coupled to each output of the N first amplifiers and to a first radio frequency (RF) output terminal;

a second group of amplifiers comprising K second amplifiers, each of the K second amplifiers comprising an output, wherein the second group of amplifiers is divided into
   a first subassembly of amplifiers, the first subassembly comprising M second amplifiers of the second group, and
   a second subassembly of amplifiers, the second subassembly comprising K-M remaining second amplifiers of the second group;
a second terminal coupled to each output of the M second amplifiers; and
a third terminal coupled to each output of the K-M second remaining amplifiers and to a second RF output terminal.

2. The amplification circuit according to claim 1, wherein the second terminal is coupled to the first RF output terminal.

3. The amplification circuit according to claim 2, wherein the second terminal is coupled to the second RF output terminal.

4. The amplification circuit according to claim 1, wherein:
the first terminal is welded to the first RF output terminal;
the second terminal is welded to either the first RF output terminal or the second RF output terminal; and
the third terminal is welded to the second RF output terminal.

5. A near-field communication (NFC) controller comprising the amplification circuit of claim 1.

6. The NFC controller according to claim 5, further comprising:
a first controller output coupled to the first terminal; and
a second controller output coupled to both the second terminal and the third terminal, wherein a ratio of a first power supplied by the first controller output to a second power supplied by the second controller output is about one.

7. The NFC controller according to claim 5, further comprising:
a first controller output coupled to both the first terminal and the second terminal; and
a second controller output coupled to the third terminal, wherein a ratio of a first power supplied by the first controller output to a second power supplied by the second controller output is different from one.

8. An NFC transceiver circuit comprising the NFC controller according to claim 5.

9. A device comprising the NFC transceiver circuit according to claim 8, the device further comprising:
a first antenna configured for read mode and coupled to the first terminal and the second terminal; and
a second antenna configured for card mode and coupled to the third terminal.

10. The device according to claim 9, wherein:
the device is a cellular phone;
the second antenna is a GSM antenna; and
the first antenna is disposed at a back side of the cellular phone and is larger than the GSM antenna.

11. An amplification circuit comprising:
a first group of amplifiers comprising N first amplifiers $A(n)$, each of the N first amplifiers $A(n)$ comprising an output and a respective resistance approximately equal to $R \times 2^n$, wherein R is a resistance value and n is an integer in a range of 1 to N;
a first terminal coupled to each output of the N first amplifiers;
a second group of amplifiers comprising K second amplifiers $B(k)$, each of the K second amplifiers $B(k)$ comprising an output and a respective resistance approximately equal to $R \times 2^k$, wherein k is an integer in a range of 1 to K, and wherein the second group of amplifiers is divided into
   a first subassembly of amplifiers, the first subassembly comprising M second amplifiers of the second group, each of the M second amplifiers comprising a resistance greater than $R \times 2^{K-M}$, and
   a second subassembly of amplifiers, the second subassembly comprising K-M remaining second amplifiers of the second group, each of the K-M remaining second amplifiers comprising a resistance less than or equal to $R \times 2^{K-M}$; the base
a second terminal coupled to each output of the M second amplifiers; and
a third terminal coupled to each output of the N-M second remaining amplifiers.

12. The amplification circuit according to claim 11, wherein R is equal to approximately 0.7 ohms.

13. A near-field communication (NFC) controller comprising the amplification circuit of claim 11.

14. An NFC transceiver circuit comprising the NFC controller according to claim 13.

15. A device comprising the NFC transceiver circuit according to claim 14, the device further comprising:
a first antenna configured for read mode and coupled to the first terminal and the second terminal; and
a second antenna configured for card mode and coupled to the third terminal.

16. The device according to claim 15, wherein:
the device is a cellular phone;
the second antenna is a GSM antenna; and
the first antenna is disposed at a back side of the cellular phone and is larger than the GSM antenna.

17. A near-field communication (NFC) transceiver circuit comprising:
an impedance matching circuit configured to be coupled to an antenna comprising a first differential input, a second differential input, and a ground terminal coupled to a ground node;
a first group of amplifiers comprising N first amplifiers, each of the N first amplifiers comprising an output;
a second group of amplifiers comprising N second amplifiers, each of the N second amplifiers comprising an output, the second group of amplifiers being divided into
   a first subassembly of amplifiers, the first subassembly comprising M second amplifiers of the second group, and
   a second subassembly of amplifiers, the second subassembly comprising N-M remaining second amplifiers of the second group;
a first terminal coupled to each output of the N first amplifiers, the first terminal configured to be coupled to the first differential input of the antenna;
a second terminal coupled to each output of the M second amplifiers, the second terminal configured to be coupled to the second differential input of the antenna; and
a third terminal coupled to each output of the N-M second remaining amplifiers, the third terminal configured to be coupled to the second differential input of the antenna.

18. The NFC transceiver circuit according to claim 17, wherein the first terminal and the second terminal are connected.

19. The NFC transceiver circuit according to claim 17, wherein a ratio of a first power supplied at the first differential input to a second power supplied at the second differential input is about one.

20. The NFC transceiver circuit according to claim 17, wherein:
- each of the N first amplifiers comprises a supplied power;
- the supplied power of each of the N first amplifiers is different from each supplied power of the remaining N first amplifiers;
- each of the N second amplifiers supplies a power; and
- the supplied power of each of the N second amplifiers is different from each supplied power of the remaining N second amplifiers.

\* \* \* \* \*